United States Patent
Yamaguchi

(10) Patent No.: US 12,538,590 B2
(45) Date of Patent: Jan. 27, 2026

(54) AVALANCHE PHOTO DIODE COMPRISING A WINDOW LAYER AND A P-TYPE REGION FORMED BY DOPING AN IMPURITY IN THE WINDOW LAYER

(71) Applicant: Mitsubishi Electric Corporation, Tokyo (JP)

(72) Inventor: Harunaka Yamaguchi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 414 days.

(21) Appl. No.: 18/040,179

(22) PCT Filed: Jan. 21, 2021

(86) PCT No.: PCT/JP2021/002058
§ 371 (c)(1),
(2) Date: Feb. 1, 2023

(87) PCT Pub. No.: WO2022/157888
PCT Pub. Date: Jul. 28, 2022

(65) Prior Publication Data
US 2023/0327040 A1    Oct. 12, 2023

(51) Int. Cl.
*H10F 30/225* (2025.01)
*H10F 77/124* (2025.01)

(52) U.S. Cl.
CPC ....... *H10F 30/225* (2025.01); *H10F 77/1243* (2025.01)

(58) Field of Classification Search
CPC ............................ H10F 30/225; H10F 77/1243
See application file for complete search history.

(56) References Cited

U.S. PATENT DOCUMENTS

| | | | |
|---|---|---|---|
| 2007/0096236 A1 | 5/2007 | Yagyu et al. | |
| 2009/0129421 A1* | 5/2009 | Kitatani | H01S 5/125 372/50.23 |
| 2014/0061588 A1* | 3/2014 | Akita | H01L 21/02507 257/21 |

FOREIGN PATENT DOCUMENTS

| | | |
|---|---|---|
| DE | 0448041 A1 * | 9/1991 |
| JP | 2007081103 A * | 3/2007 |

(Continued)

OTHER PUBLICATIONS

A. Dadgar et al., "Growth of Ru doped semi-insulating InP by low pressure metalorganic chemical vapor deposition", Elsevier, Journal of Crystal Growth 195, 1998, pp. 69-73.

(Continued)

*Primary Examiner* — Suberr L Chi
(74) *Attorney, Agent, or Firm* — Studebaker Brackett PLLC

(57) ABSTRACT

A buffer layer (2), a multiplication layer (3), a light-absorbing layer (5), a window layer (6,7), and a contact layer (8) are sequentially stacked on a semiconductor substrate (1). The window layer (6,7) is doped with an impurity to form a p-type region (9). A bandgap of the window layer (6,7) is greater than a bandgap of the light-absorbing layer (5). The window layer (6,7) includes a first window layer (6), and a second window layer (7) formed on the first window layer (1). A diffusion rate of the impurity in the second window layer (7) is higher than a diffusion rate of the impurity in the first window layer (6). The first window layer (6) is a Ru, Rh or Os-doped InP layer.

10 Claims, 5 Drawing Sheets

(56) References Cited

FOREIGN PATENT DOCUMENTS

| | | |
|---|---|---|
| JP | 4166560 B2 | 10/2008 |
| JP | 4956944 B2 | 6/2012 |
| JP | 2013-051338 A | 3/2013 |

OTHER PUBLICATIONS

International Search Report issued in PCT/JP2021/002058; mailed Apr. 13, 2021.

\* cited by examiner

AVALANCHE PHOTO DIODE COMPRISING A WINDOW LAYER AND A P-TYPE REGION FORMED BY DOPING AN IMPURITY IN THE WINDOW LAYER

FIELD

The present disclosure relates to an avalanche photo diode (APD).

BACKGROUND

An avalanche photo diode is used particularly in a receiving side device in long-distance transmission in the optical communication field. When light is incident on the avalanche photo diode, photocarriers constituted with electrons and holes are generated in an InGaAs light-absorbing layer. Among these, the electrons are multiplied by an avalanche effect when the electrons pass through an AlInAs multiplication layer. As a result of this, a received optical signal can be amplified.

In a case where a p-type region of the avalanche photo diode is formed through Zn diffusion, an AlInAs window layer with a low Zn diffusion rate has been positioned between the InGaAs light-absorbing layer and an InP window layer (see, for example, PTL 1). This can make it possible to control the depth of Zn diffusion, so that it is possible to form desired pn junction.

CITATION LIST

Patent Literature

[PTL 1] JP 4956944 B2

SUMMARY

Technical Problem

However, a crystalline material having a high Al composition has greater thermal resistance compared to InP. Thus, there has been a case where electric characteristics degrade due to an increase in temperature as a result of photocarriers being generated upon light incidence and local heat being generated.

The present disclosure has been made to solve the problem described above, and an object thereof is to obtain an avalanche photo diode in which heat dissipation can be improved.

Solution to Problem

An avalanche photo diode according to the present disclosure includes: a semiconductor substrate; a buffer layer, a multiplication layer, a light-absorbing layer, a window layer, and a contact layer sequentially stacked on the semiconductor substrate; and a p-type region formed by doping an impurity in the window layer, wherein a bandgap of the window layer is greater than a bandgap of the light-absorbing layer, the window layer includes a first window layer, and a second window layer formed on the first window layer, a diffusion rate of the impurity in the second window layer is higher than a diffusion rate of the impurity in the first window layer, and the first window layer is a Ru, Rh or Os-doped InP layer.

Advantageous Effects of Invention

In the present disclosure, by using the Ru-doped InP window layer, it is possible to improve heat dissipation compared to the prior art in which the AlInAs window layer is used. As a result, it is possible to implement an avalanche photo diode that excels in temperature characteristics.

DESCRIPTION OF EMBODIMENTS

An avalanche photo diode according to the embodiments of the present disclosure will be described with reference to the drawings. The same components will be denoted by the same symbols, and the repeated description thereof may be omitted.

Embodiment 1

Figure 1:
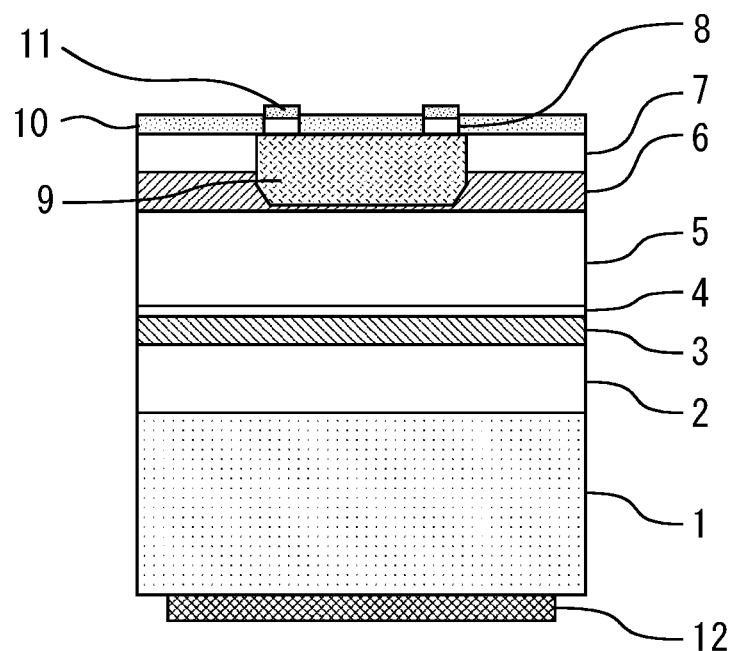
FIG. 1 is a cross-sectional view illustrating an avalanche photo diode according to Embodiment 1.

FIG. 1 is a cross-sectional view illustrating an avalanche photo diode according to Embodiment 1. An n-type InP buffer layer 2, an i-type AlInAs avalanche multiplication layer 3, a p-type AlInAs electric field relaxing layer 4, an n-type InGaAs light-absorbing layer 5, a semi-insulating Ru-doped InP window layer 6 doped with ruthenium (Ru), an n-type InP window layer 7, and a p-type InGaAs contact layer 8 are sequentially stacked on an n-type InP substrate 1. Bandgaps of the Ru-doped InP window layer 6 and the n-type InP window layer 7 are greater than a bandgap of the n-type InGaAs light-absorbing layer 5.

The n-type InP buffer layer 2 has carrier concentration of 1 to $5 \times 10^{18}$ cm$^{-3}$ and has a film thickness of 0.1 to 0.5 µm. The i-type AlInAs avalanche multiplication layer 3 has a film thickness of 0.1 to 0.2 µm. The p-type AlInAs electric field relaxing layer 4 has carrier concentration of 0.5 to $1 \times 10^{18}$ cm$^{-3}$ and has a film thickness of 0.05 to 0.15 µm. The n-type InGaAs light-absorbing layer 5 has carrier concentration of 1 to $5 \times 10^{15}$ cm$^{-3}$ and has a film thickness of 1 to 1.5 µm. The Ru-doped InP window layer 6 has doping concentration of 0.1 to $1.0 \times 10^{18}$ cm$^{-3}$ and has a film thickness of 0.05 to 1 µm. The n-type InP window layer 7 has carrier concentration of 0.1 to $5 \times 10^{15}$ cm$^{-3}$ and has a film thickness of 0.5 to 1 µm. The p-type InGaAs contact layer 8 has carrier concentration of 1 to $5 \times 10^{18}$ cm$^{-3}$ and has a film thickness of 0.1 to 0.5 µm.

It is reported that Zn is scarcely diffused in a Ru-doped InP even if the Ru-doped InP has contact with a Zn-doped Inp layer. Thus, a Zn diffusion rate of the n-type InP window layer 7 is higher than a Zn diffusion rate of the Ru-doped InP window layer 6. Using the characteristics, Zn is doped in the n-type InP window layer 7 with a high Zn diffusion rate to form a p-type region 9, and a depth of the p-type region 9 is controlled with the Ru-doped InP window layer 6 with a low Zn diffusion rate. As a result of this, a desired shape of pn junction can be obtained.

The concentric p-type InGaAs contact layer 8 is formed on the p-type region 9. An upper surface other than the p-type InGaAs contact layer 8 is covered with a surface protective film 10. The surface protective film 10 is constituted with SiNx and also serves as an antireflection film. A p-type electrode 11 is formed on the p-type InGaAs contact layer 8. A material of the p-type electrode 11 is AuZn. and the like. An n-type electrode 12 is formed on a back side of the n-type InP substrate 1. A material of the n-type electrode 12 is AuGeNi, and the like.

Subsequently, a method for manufacturing an avalanche photo diode according to the present embodiment will be described. The n-type InP buffer layer 2, the i-type AlInAs avalanche multiplication layer 3, the p-type AlInAs electric field relaxing layer 4, the n-type InGaAs light-absorbing layer 5, the Ru-doped InP window layer 6, the n-type InP window layer 7 and the p-type InGaAs contact layer 8 are sequentially grown on the n-type InP substrate 1 at a growth temperature of approximately 600° C. through metal organic vapor phase epitaxy (MOVPE). Note that molecular beam epitaxy (MBE), or the like, may be used as a crystal growth method.

An SiOx film is formed on a wafer surface through sputtering, or the like, to manufacture a circular pattern mask having a diameter of 50 μm. Zn is diffused in a circular portion with no mask to form the p-type region 9. Then, etching is performed so that the p-type InGaAs contact layer 8 remains on the p-type region 9 only in a concentric manner with a width of 2.5 to 5.0 μm. Then, after the surface protective film 10 is formed on the wafer surface, the surface protective film 10 on only the p-type InGaAs contact layer 8 is removed. The p-type electrode 11 is formed on the p-type InGaAs contact layer 8. At last, the back side of the n-type InP substrate 1 is ground, and the n-type electrode 12 is formed on the back side.

Subsequently, operation of the avalanche photo diode according to the present embodiment will be described. A reverse bias voltage is externally applied so that the n-type electrode 12 side becomes positive, and the p-type electrode 11 side becomes negative. In this state, light of a 1.3 μm band or a 1.5 μm band that is an optical communication wavelength band is made to incident from the p-type electrode 11 side to the p-type region 9. The light is absorbed in the n-type InGaAs light-absorbing layer 5, electron-hole pairs that are photocarriers are generated, the electrons move to the n-type electrode 12 side, and the holes move to the p-type electrode 11 side. When the reverse bias voltage is sufficiently high, the electrons are ionized in the i-type AlInAs avalanche multiplication layer 3 to generate new electron-hole pairs, and the newly generated electrons and holes together cause further ionization. This causes avalanche multiplication in which electrons and holes are multiplied in an avalanche manner. Thus, a heat source of the avalanche photo diode upon avalanche operation concentrates on around the i-type AlInAs avalanche multiplication layer 3.

Figure 2:
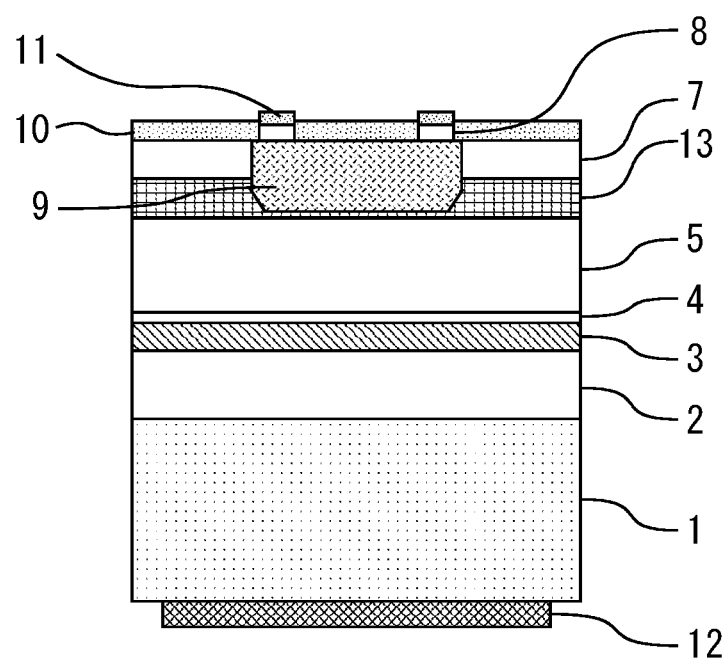
FIG. 2 is a cross-sectional view illustrating an avalanche photo diode according to the comparative example.

Subsequently, effects of the present embodiment will be described in comparison to a comparative example. FIG. 2 is a cross-sectional view illustrating an avalanche photo diode according to the comparative example. In the comparative example, an n-type AlInAs window layer 13 is used in place of the Ru-doped InP window layer 6 in Embodiment 1. Other configurations are the same, and both methods for manufacturing are substantially the same. The p-type region 9 is formed in the n-type InP window layer 7 with a high Zn diffusion rate, and a depth of the p-type region 9 is controlled with the n-type AlInAs window layer 13 with a low Zn diffusion rate. While InP has thermal resistance of 68 [W/mK], AlInAs has thermal resistance of 10 [W/mK] which is approximately seven times. Thus, the heat dissipation of a device structure is determined by how thin the film thickness of the whole AlInAs is. In the present embodiment, by using the Ru-doped InP window layer 6, it is possible to improve heat dissipation compared to the comparative example in which the n-type AlInAs window layer 13 is used. As a result, it is possible to implement an avalanche photo diode that excels in temperature characteristics.

Figure 3:
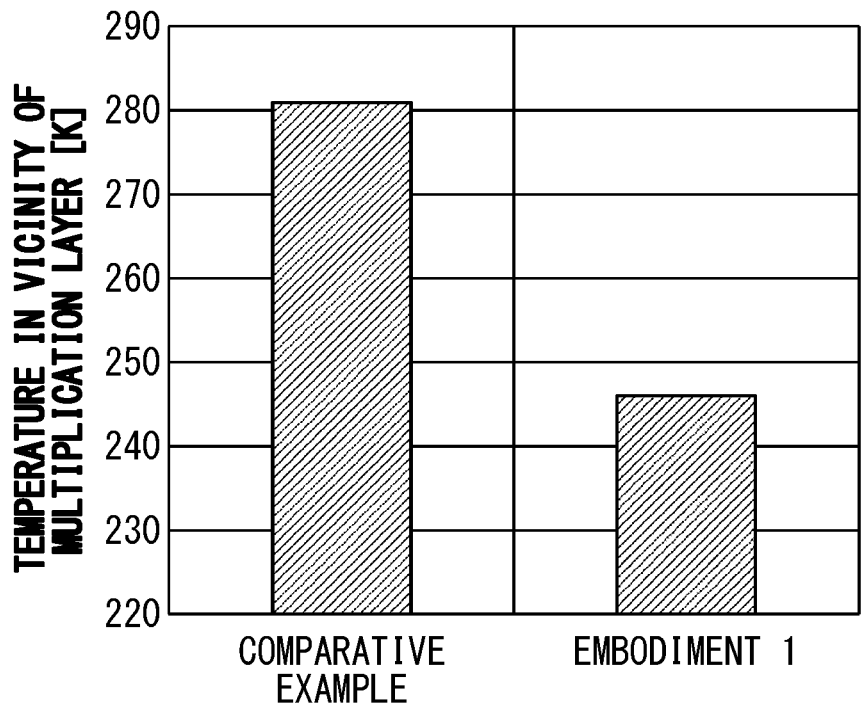
FIG. 3 is a view indicating temperatures in the vicinity of multiplication layers of the avalanche photo diodes according to Embodiment 1 and the comparative example.

FIG. 3 is a view indicating temperatures in the vicinity of multiplication layers of the avalanche photo diodes according to Embodiment 1 and the comparative example. In calculation, a film thickness of the n-type AlInAs window layer 13 in the comparative example is set at 1 um, a film thickness of the Ru-doped InP window layer 6 in Embodiment 1 is set at 1 um, and configurations of other layers are made the same. It is defined that a state of 0 [K] is achieved by bringing the substrate side into contact with an ideal heatsink assuming that light is incident, and a heat source of 0.6 W is generated in the i-type AlInAs avalanche multiplication layer 3. A heat conduction equation is analytically solved for the temperature in the vicinity of the i-type AlInAs avalanche multiplication layer 3 in this case to calculate a temperature from the heatsink that serves as a baseline. While the temperature in the vicinity of the i-type AlInAs avalanche multiplication layer 3 is 281 K in the comparative example, the temperature is lowered to 246 [K] in Embodiment 1, which means that heat dissipation is improved by approximately 14%.

Figure 4:
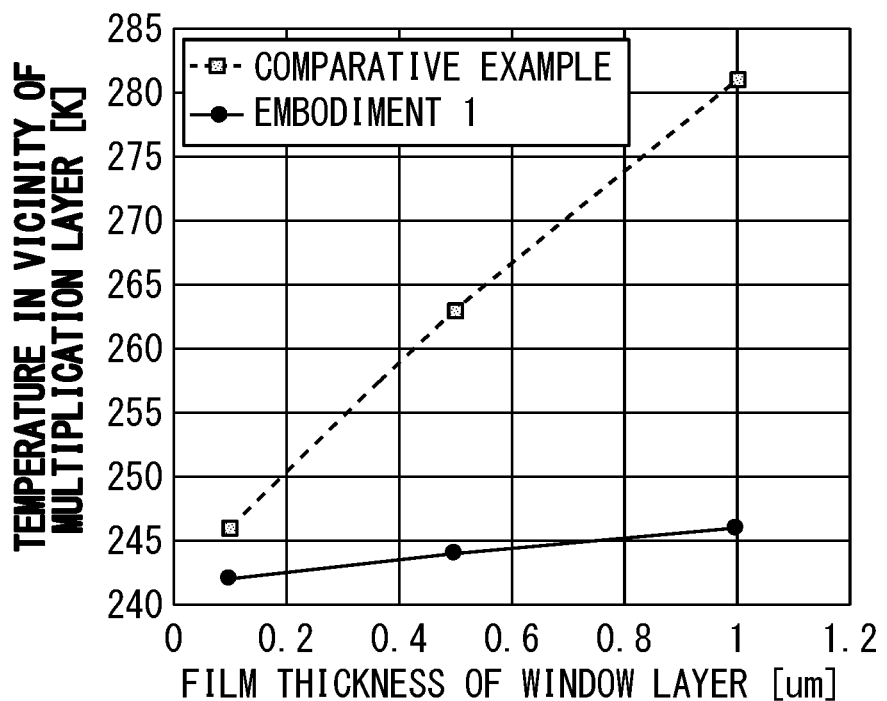
FIG. 4 is a view indicating temperatures in the vicinity of the multiplication layers in a case where the film thicknesses of the window layers are changed in the avalanche photo diodes according to Embodiment 1 and the comparative example.

FIG. 4 is a view indicating temperatures in the vicinity of the multiplication layers in a case where the film thicknesses of the window layers are changed in the avalanche photo diodes according to Embodiment 1 and the comparative example. Also in the comparative example, if the film thickness of the n-type AlInAs window layer 13 is made thin to 0.05 um, the temperature can be improved to substantially the same temperature as in a case where the Ru-doped InP window layer 6 has a film thickness of 1 um in Embodiment 1. However, it is necessary to make the film thickness of the n-type AlInAs window layer 13 equal to or greater than 0.5 um to control the depth of the p-type region 9. On the other hand, even if the film thickness of the Ru-doped InP window layer 6 with low thermal resistance is changed between 0.05 um and 1 um, change in the temperature is approximately 1% and is hardly affected by the film thickness. Thus, in Embodiment 1, a problem does not occur in terms of temperature characteristics even if the film thickness of the window layer is made relatively thick, so that the p-type region 9 can be easily formed. Note that making the film thicknesses of both the n-type AlInAs window layer 13 and the Ru-doped InP window layer 6 thicker affects high-speed responsivity, and thus, there is an upper limit in the film thickness of the window layer.

Note that Rh (rhodium) or Os (osmium)-doped InP layer with doping concentration of $1.0 \times 10^{18}$ cm$^{-3}$ may be used in place of the Ru-doped InP window layer 6. The Rh-doped InP layer is thermally stable in a similar manner to the Ru-doped InP layer. It is reported that Zn is scarcely diffused in the Rh-doped InP even if the Rh-doped InP has contact with the Zn-doped InP layer. A trap level of carriers in the Rh-doped InP is deeper than a trap level of carriers in the Ru-doped InP, and thus, the temperature characteristics of the formed p-type region 9 and the avalanche photo diode become further stable. The same applies to the Os-doped InP layer.

Embodiment 2

Figure 5:
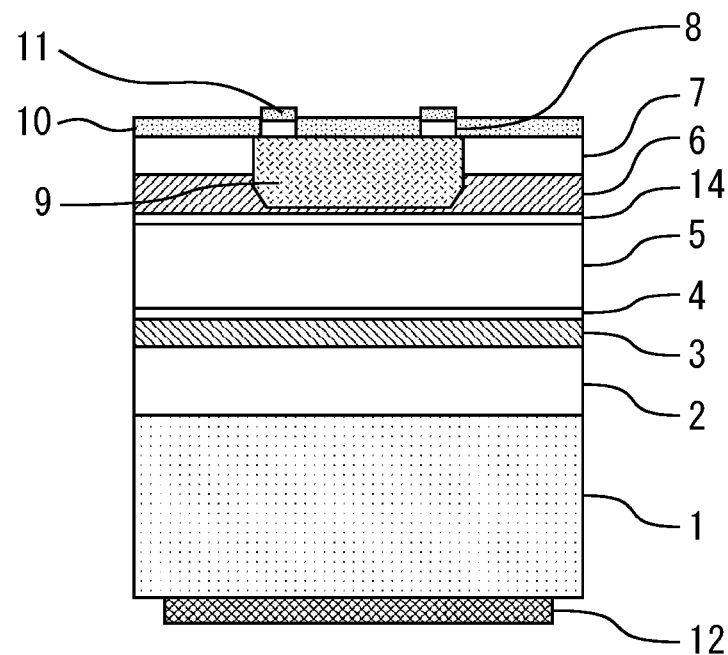
FIG. 5 is a cross-sectional view illustrating an avalanche photo diode according to Embodiment 2.

FIG. 5 is a cross-sectional view illustrating an avalanche photo diode according to Embodiment 2. An n-type InGaAsP transition layer 14 having a film thickness of 0.01 to 0.1 μm and carrier concentration of 1 to $5\times10^{15}$ cm$^{-3}$ is inserted between the n-type InGaAs light-absorbing layer 5 and the Ru-doped InP window layer 6. Other configurations are similar to the configurations in Embodiment 1.

Band discontinuities between InGaAs and InP can be relaxed by inserting the n-type InGaAsP transition layer 14. This can improve high-speed responsivity of photocarriers generated upon light incidence.

When the material of the n-type InGaAsP transition layer 14 is expressed as $In_{1-x}Ga_xAs_yP_{1-y}$ (0<x<1, 0<y<1), the InGaAsP layer with a desired bandgap can be obtained by controlling compositions of x and y. For example, in a case where x=0.28 and y=0.61, a bandgap λ (Eg) of the n-type InGaAsP transition layer 14 becomes 1.2 eV.

InGaAsP has thermal resistance smaller than thermal resistance of AlInAs in a similar manner to InP. Further, in terms of high-speed responsivity, the n-type InGaAsP transition layer 14 is stacked thinly, that is, equal to or less than 0.1 μm. Thus, heat dissipation does not degrade by addition of the n-type InGaAsP transition layer 14. Further, the InGaAsP layer is lattice-matched with InP, and thus, can be relatively easily grown. Other effects similar to the effects in Embodiment 1 can be obtained.

Note that the n-type InGaAsP transition layer 14 is not limited to a single layer of an InGaAsP layer and may be constituted with a plurality of layers. However, a wavelength determined by a bandgap of $In_{1-x}Ga_xAs_yP_{1-y}$ becomes preferably gradually shorter from the n-type InGaAs light-absorbing layer 5 toward the Ru-doped InP window layer 6. In this case, it is further effective if the bandgap is continuously changed instead of the bandgap being changed stepwise. Further, the material of the transition layer is not limited to InGaAsP, and similar effects can be expected with other materials constituted with compositions of, for example, Al, Ga, In, As, P, Sb, and the like, if the bandgap is between InGaAs and InP.

Embodiment 3

Figure 6:
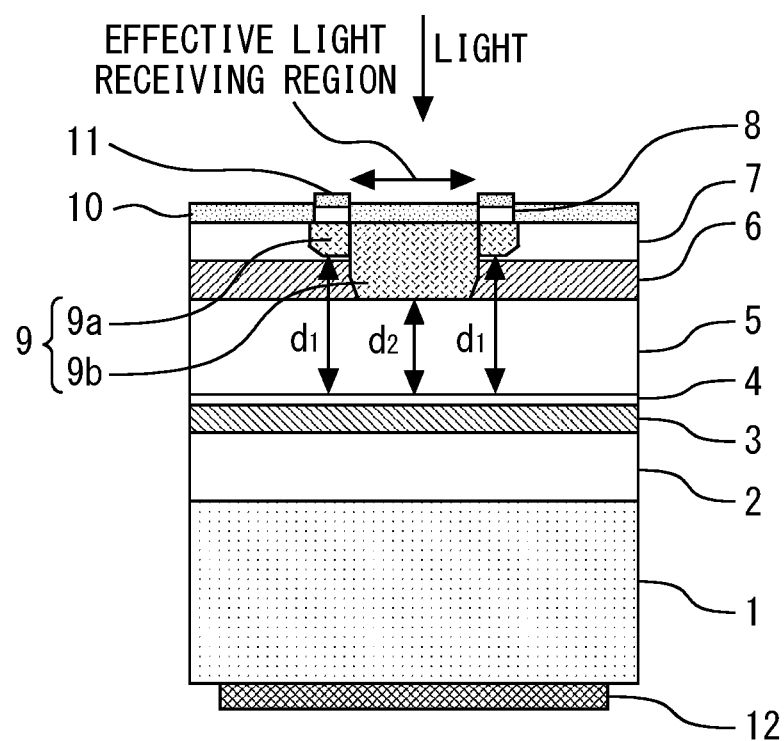
FIG. 6 is a cross-sectional view illustrating an avalanche photo diode according to Embodiment 3.

FIG. 6 is a cross-sectional view illustrating an avalanche photo diode according to Embodiment 3. The p-type region 9 has a stepwise shape including a first p-type region 9a and a second p-type region 9b that is deeper than the first p-type region 9a. Other configurations are similar to the configurations in Embodiment 1.

Subsequently, a method for manufacturing the first p-type region 9a and the second p-type region 9b will be described. First, an SiOx film is formed on a wafer surface through sputtering, or the like, to form a first mask having a circular opening with a diameter of 50 μm. Zinc is diffused from the circular opening not covered with the first mask to form the second p-type region 9b. In this event, a depth of Zn diffusion in the second p-type region 9b is controlled to be within the n-type InP window layer 7.

Then, a second mask having a circular opening with a diameter of 30 μm is formed thereon. Zinc is diffused from the circular opening not covered with the second mask to form the first p-type region 9a. In this event, a depth of Zn diffusion in the first p-type region 9a is controlled to be within the Ru-doped InP window layer 6.

As described above, in the present embodiment, the p-type region 9 is formed stepwise. In this case, pn junction capacitance C is expressed as $C=\varepsilon S_1/d_1+\varepsilon S_2/d_2+\varepsilon S_1/d_1$, where permittivity is ε [F/m], a pn junction area in the first p-type region 9a is $S_1$ [m$^2$], a pn junction area in the second p-type region 9b is $S_2$ [m$^2$], a distance (depletion layer distance) from a lower end of the n-type InGaAs light-absorbing layer 5 to the first p-type region 9a is $d_1$ [m], and a distance (depletion layer distance) from the lower end of the n-type InGaAs light-absorbing layer 5 to the second p-type region 9b is $d_2$ [m].

$d_1>d_2$, and thus, the pn junction area can be reduced. This can reduce capacitance of a light receiving region of the avalanche photo diode. As a result of this, high-speed responsivity of photo carriers generated upon light incidence is improved compared to Embodiment 1. Further, in a case where the p-type region 9 in Embodiment 1 is simply narrowed to reduce the pn junction area, an effective light receiving region in which light is received becomes narrow, which degrades usability of the avalanche photo diode. In contrast, in the present embodiment, high-speed responsivity can be achieved without narrowing the effective light receiving region by forming the p-type region 9 stepwise. Other effects similar to the effects of Embodiment 1 can be obtained.

Figure 7:
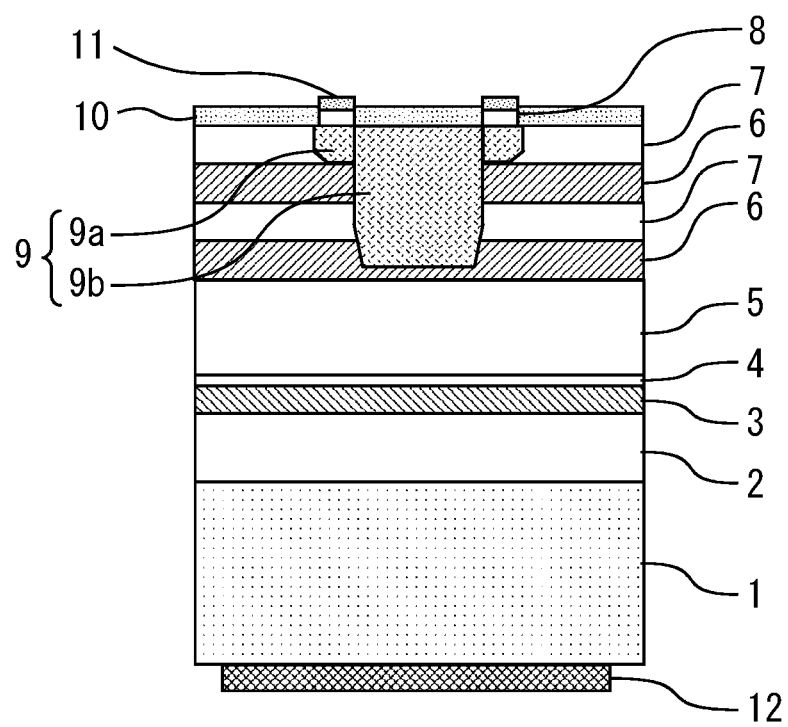
FIG. 7 is a cross-sectional view illustrating a modification of the avalanche photo diode according to Embodiment 3.

FIG. 7 is a cross-sectional view illustrating a modification of the avalanche photo diode according to Embodiment 3. A plurality of pairs of the Ru-doped InP window layer 6 with a low Zn diffusion rate and the n-type InP window layer 7 with a high Zn diffusion rate are alternately stacked. By this means, the p-type region 9 can be formed to have two or more steps. The window layer is constituted with InP with a low thermal resistance value, and heat dissipation does not substantially depend on a film thickness of the InP window layer, so that such control can be performed.

Embodiment 4

Figure 8:
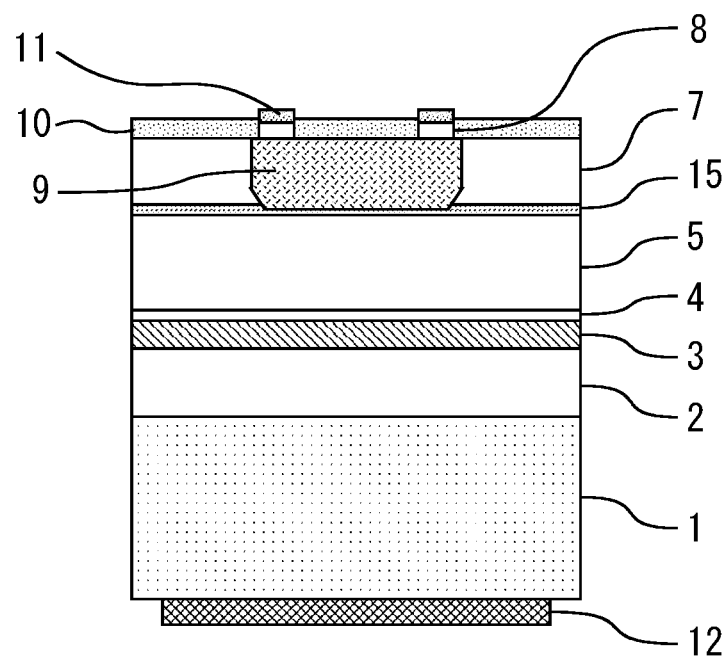
FIG. 8 is a cross-sectional view illustrating an avalanche photo diode according to Embodiment 4.

FIG. 8 is a cross-sectional view illustrating an avalanche photo diode according to Embodiment 4. In the present embodiment, in place of the Ru-doped InP window layer 6 in Embodiment 1, an Si delta-doped layer 15 with sheet carrier concentration of 0.1 to $1.0\times10^{12}$ cm$^{-2}$ is formed on the n-type InGaAs light-absorbing layer 5 at the boundary of the n-type InGaAs light-absorbing layer 5 and the n-type InP window layer 7. Other configurations are similar to the configurations in Embodiment 1.

The Si delta-doped layer 15 is a layer obtained by supplying an Si material without supplying In, Ga, and the like, thereby two-dimensionally stacking Si in angstrom unit on a crystal of the n-type InGaAs light-absorbing layer 5. The carrier concentration of the Si delta-doped layer 15 is expressed as sheet carrier concentration (cm$^{-2}$).

Si in the Si delta-doped layer 15 stops diffusion of Zn from the p-type region 9, and thus, Zn remains in the Si delta-doped layer 15 without reaching the n-type InGaAs light-absorbing layer 5. This can make it possible to obtain a desired shape of pn junction.

Further, the Si delta-doped layer 15 is a two-dimensional layer and has substantially an angstrom level film thickness. It is therefore considered that there is no influence on heat dissipation even if the Si delta-doped layer 15 is formed.

Further, the Si delta-doped layer 15 can be relatively easily manufactured using versatile Si without using a new material like ruthenium. Si delta doping is a technique to be used in an HEMT device, and the like, and sheet carrier concentration can be relatively easily controlled in a range between 0.01 and $10.0\times10^{12}$ cm$^{-2}$ by controlling a temperature or a material supply amount.

Figure 9:
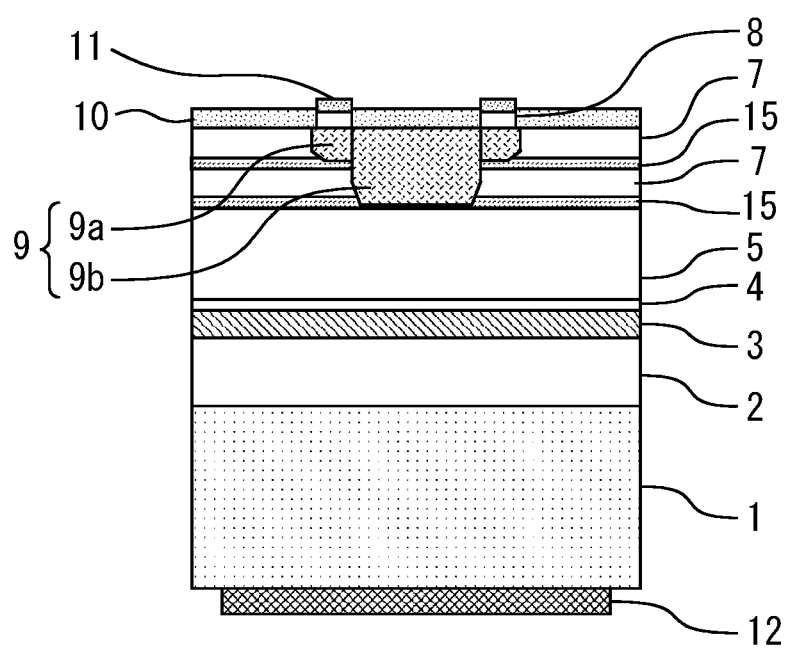
FIG. 9 is a cross-sectional view illustrating a modification of the avalanche photo diode according to Embodiment 4.

FIG. 9 is a cross-sectional view illustrating a modification of the avalanche photo diode according to Embodiment 4. A plurality of pairs of the Si delta-doped layer 15 and the n-type InP window layer 7 are alternately stacked. By this means, the p-type region 9 can be formed to have two or more steps. It is therefore possible to reduce an area of pn junction and reduce capacitance of a light receiving region of the avalanche photo diode.

Note that while AlInAs is used in the multiplication layer in Embodiment 1 to Embodiment 4. AlGaInAs may be used as a material of the multiplication layer. The material of the multiplication layer only requires to be a semiconductor which is lattice-matched with InP and in which an ionization rate of electrons is greater than an ionization rate of holes, and AlInAs/AlGaInAs superlattice, InGaAsP, AlAsSb or AlGaAsSb may be used.

Further, in a case where AlInAs is used in the multiplication layer, an AlInAs layer which is easily grown may be grown as a buffer layer to prevent diffusion of impurities from the InP substrate or improve crystalline quality. However, a film thickness of a material with a higher Al composition becomes thicker, which degrades heat dissipation.

Further, in a case where InP is used in the multiplication layer, while excellent heat dissipation can be obtained, noise characteristics become worse compared to a case where an AlInAs multiplication layer is used. Further, in a case of this hole multiplication type avalanche photo diode, it is necessary to form a guard ring structure within a device to prevent local electric field concentration. Thus, a special method for manufacturing is required, which makes manufacturing difficult.

While a case where Zn is diffused in the p-type region 9 has been described, it is only necessary to diffuse atom that provide a p conductivity type, and for example, Cd, Be, or the like, may be used in place of Zn. As a method for diffusing Zn, a solid-phase diffusion method using ZnO or a Zn vapor-phase diffusion method using a crystal growth furnace may be used.

Further, while a surface incidence type structure in which light to be detected is made incident from the p-type electrode 11 side to the p-type region 9 has been described, similar effects can also be expected in a back surface incidence type structure in which light is made incident inversely from the n-type InP substrate 1 side, and an end face incidence type structure in which light is made incident from an end face of the n-type InGaAs light-absorbing layer 5.

REFERENCE SIGNS LIST

1 n-type InP substrate (semiconductor substrate); 2 n-type InP buffer layer (buffer layer); 3 i-type AlInAs avalanche multiplication layer (avalanche multiplication layer); 5 n-type InGaAs light-absorbing layer (light-absorbing layer); 6 Ru-doped InP window layer (first window layer); 7 n-type InP window layer (second window layer); 8 p-type InGaAs contact layer (contact layer); 9 p-type region; 9a first p-type region; 9b second p-type region; 14 n-type InGaAsP transition layer (transition layer); 15 Si delta-doped layer

The invention claimed is:

1. An avalanche photo diode comprising:
a semiconductor substrate;
a buffer layer, a multiplication layer, a light-absorbing layer, a window layer, and a contact layer sequentially stacked on the semiconductor substrate; and
a p-type region formed by doping an impurity in the window layer,
wherein a bandgap of the window layer is greater than a bandgap of the light-absorbing layer,
the window layer includes a first window layer, and a second window layer formed on the first window layer,
a diffusion rate of the impurity in the second window layer is higher than a diffusion rate of the impurity in the first window layer, and
the first window layer is a Ru, Rh or Os-doped InP layer.

2. The avalanche photo diode according to claim 1, wherein the impurity is Zn, Cd or Be.

3. The avalanche photo diode according to claim 1, further comprising a transition layer inserted between the light-absorbing layer and the window layer,
wherein a bandgap of the transition layer is between the bandgap of the light-absorbing layer and a bandgap of InP.

4. An avalanche photo diode comprising:
a semiconductor substrate;
a buffer layer, a multiplication layer, a light-absorbing layer, a window layer, and a contact layer sequentially stacked on the semiconductor substrate; and
a p-type region formed by doping an impurity in the window layer,
wherein a bandgap of the window layer is greater than a bandgap of the light-absorbing layer, and
an Si delta-doped layer is formed at a boundary of the light-absorbing layer and the window layer.

5. The avalanche photo diode according to claim 1, wherein the p-type region includes a first p-type region and a second p-type region that is deeper than the first p-type region.

6. The avalanche photo diode according to claim 2, further comprising a transition layer inserted between the light-absorbing layer and the window layer,
wherein a bandgap of the transition layer is between the bandgap of the light-absorbing layer and a bandgap of InP.

7. The avalanche photo diode according to claim 2, wherein the p-type region includes a first p-type region and a second p-type region that is deeper than the first p-type region.

8. The avalanche photo diode according to claim 3, wherein the p-type region includes a first p-type region and a second p-type region that is deeper than the first p-type region.

9. The avalanche photo diode according to claim 4, wherein the p-type region includes a first p-type region and a second p-type region that is deeper than the first p-type region.

10. The avalanche photo diode according to claim 6, wherein the p-type region includes a first p-type region and a second p-type region that is deeper than the first p-type region.

* * * * *